(12) United States Patent
Farrow

(10) Patent No.: US 6,359,519 B1
(45) Date of Patent: Mar. 19, 2002

(54) SELF-TIMED NUMERICALLY CONTROLLED RING OSCILLATOR

(75) Inventor: Cecil William Farrow, Highlands, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/502,138

(22) Filed: Feb. 11, 2000

(51) Int. Cl.[7] .............................. H03B 5/24; H03L 7/06; H03L 7/085; H03L 7/16
(52) U.S. Cl. ........................ 331/57; 331/1 A; 331/16; 331/17; 331/18; 331/25; 331/179; 331/34; 327/156; 327/159
(58) Field of Search ....................... 331/34, 57, 1 A, 331/16, 17, 18, 25, 179; 327/156–159; 375/376; 455/260; 360/51

(56) References Cited

U.S. PATENT DOCUMENTS

| | | | | |
|---|---|---|---|---|
| 5,315,271 A | * | 5/1994 | Pascual et al. ............... | 331/25 |
| 5,420,546 A | * | 5/1995 | Watanabe et al. ............ | 331/57 |
| 5,490,182 A | * | 2/1996 | Arai ............................ | 375/376 |
| 5,708,381 A | * | 1/1998 | Higashisaka ................ | 327/276 |
| 5,796,298 A | * | 8/1998 | Krech, Jr. et al. ........... | 327/407 |
| 5,815,023 A | * | 9/1998 | Webber et al. .............. | 327/407 |
| 6,046,644 A | * | 4/2000 | Pitot et al. .................. | 331/1 A |
| 6,094,081 A | * | 7/2000 | Yanagiuchi ................. | 327/258 |
| 6,127,872 A | * | 10/2000 | Kumata ...................... | 327/276 |

* cited by examiner

*Primary Examiner*—David Mis
(74) *Attorney, Agent, or Firm*—Ryan, Mason & Lewis,LLP

(57) ABSTRACT

A method and apparatus are disclosed for numerically controlling a ring oscillator. The disclosed programmable period ring oscillator selectively switches pairs of inverters into or out of the ring oscillator to provide a desired frequency. In one implementation, a programmable period ring oscillator provides a range of five to nine inverters that may selectively be included in the ring oscillator in increments of two inverters. A frequency synthesizer is disclosed that aligns the phase of the programmable ring oscillator with a reference signal. The frequency synthesizer generates a phase difference signal that is that is representative of the phase difference between the reference signal and the ring oscillator output. The phase difference signal is utilized to correct the frequency of the ring oscillator, so that the mean phase of the ring oscillator corresponds to the mean phase of the reference signal. The state of all of the stages in the ring oscillator are sampled, to permit the phase of the ring oscillator to be measured to a fraction of one cycle.

19 Claims, 11 Drawing Sheets

IF MSB=0; THEN SELECT C=X, x=0 → 7
1, THEN SELECT D=X, x=8 → 15

TOTAL PHASE=Xx

SELF-TIMED NUMERICALLY CONTROLLED RING OSCILLATOR

FIELD OF THE INVENTION

The present invention relates to methods and apparatus for generating an oscillator signal in digital communication systems, and more particularly to digitally controlled oscillator circuitry that provides selectable phase resolution.

BACKGROUND OF THE INVENTION

Digital communication systems transfer information between two devices over a communication channel. In synchronous digital communications, it is often necessary to extract clock information from the received input signal or to otherwise generate a clock signal. Phase-locked loop (PLL) circuits are frequently utilized to lock an oscillator in phase with a reference signal. PLL circuits are often utilized within receivers in digital communication systems to generate a local clock signal that is phase aligned with an incoming reference signal. The phase aligned local clock signal facilitates the receipt and processing of data sent by a transmitter in the communication system.

A conventional PLL circuit includes a phase detector, a filter and a voltage-controlled oscillator (VCO). In the conventional PLL circuit, the phase detector compares the incoming reference signal and the output of the VCO. The phase detector generates an error signal that is representative of the phase difference of the reference signal and the VCO output. The error signal is filtered and applied to the control input of the VCO to produce an output signal that tracks the phase of the reference signal.

While such conventional PLL circuits provide effective generation of clock signals for many communication applications, they suffer from a number of limitations, which if overcome, could greatly improve the efficiency and utility of clock recovery circuits. For example, the VCOs in such conventional PLL circuits provide limited frequency control and frequency range and a slow reaction time. Due to relatively slow acquisition time constants, such VCOs do not permit a sudden change in frequency. A need therefore exists for an oscillator circuit that provides more precise frequency control and a broader frequency range. A further need exists for a numerically controlled ring oscillator that is adaptable for the implementation of a wide range of clock recovery and other signal generation applications.

SUMMARY OF THE INVENTION

Generally, a method and apparatus are disclosed for numerically controlling a ring oscillator. The disclosed programmable period ring oscillator selectively switches pairs of inverters into or out of the ring oscillator to provide a desired frequency. In one implementation, a programmable period ring oscillator provides a range of five to nine inverters that may selectively be included in the ring oscillator in increments of two inverters. The exemplary five-to-nine programmable period ring oscillator consists of three inverters and three multiplexers connected in a ring. Each multiplexer includes two gate delays and has a selection input. By selecting one of the three multiplexers, the selected multiplexer and all lower order multiplexers are included in the ring.

According to another aspect of the invention, a frequency synthesizer is disclosed that helps align the phase of the programmable ring oscillator with a reference signal. The frequency synthesizer compares the output of a ring oscillator with the output of a reference signal produced by a crystal controlled oscillator. The frequency synthesizer generates a phase difference signal that is representative of the phase difference between the reference signal and the ring oscillator output. The phase difference signal is utilized to correct the frequency of the ring oscillator, so that the mean phase of the ring oscillator corresponds to the mean phase of the reference signal.

According to yet another aspect of the invention, the state of all of the stages in the ring oscillator are sampled, to permit the phase of the ring oscillator to be measured to a fraction of one cycle. The LSBs of the reference signal contain the complete phase information of the reference signal. Thus, by taking the difference in the states of the ring oscillator and the reference signal, an accurate error signal is obtained to adjust the output frequency of the ring oscillator.

A more complete understanding of the present invention, as well as further features and advantages of the present invention, will be obtained by reference to the following detailed description and drawings.

BRIEF DESCRIPTION OF THE DRAWINGS

FIG. 8 is a sample table from the phase look-up state table of FIG. 7;

DETAILED DESCRIPTION

Figure 1A:
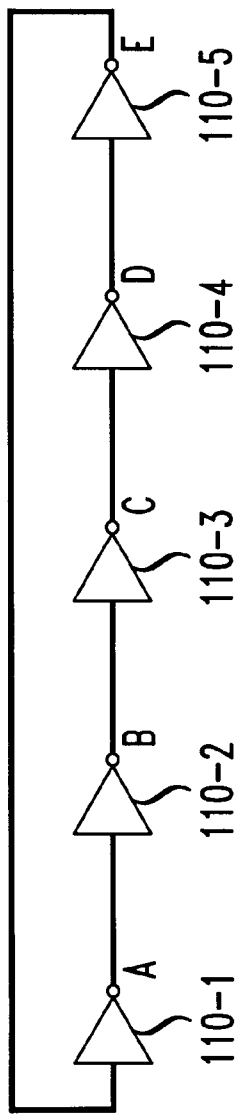
FIG. 1A illustrates a conventional 5-inverter ring oscillator consisting of five inverters connected in a ring.
Figure 1B:
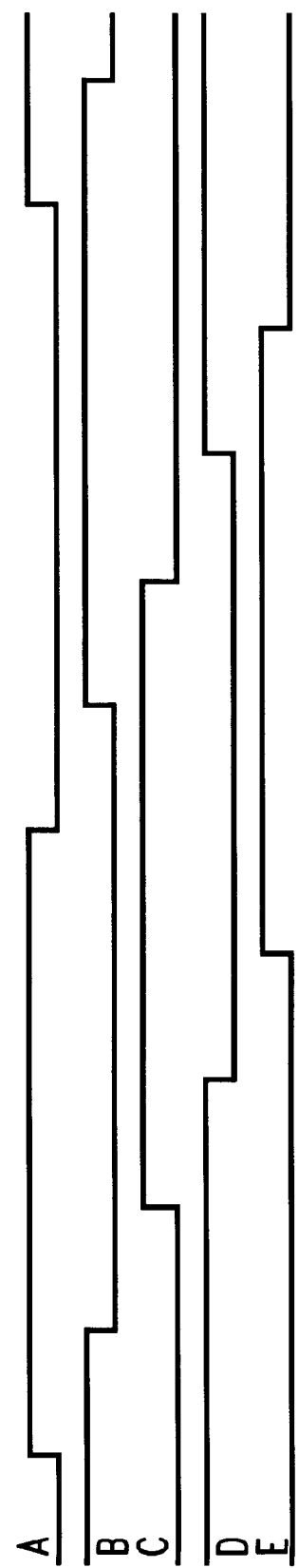
FIG. 1B illustrates the periodic waveforms obtained at the output of each inverter of FIG. 1A.

FIG. 1A illustrates a 5-inverter ring oscillator 100 consisting of five inverters 110-1 through 110-5 connected in a ring. It is well known that a circuit consisting of an odd number, N, of inverters in a ring, will oscillate with a period equal to 2*N inverter delays. Thus, the period of the 5-inverter ring oscillator 100 will be 10 inverter delays. FIG. 1B illustrates the periodic waveforms A, B, C, D, E that are each obtained at the output of the respective inverter 110-1 through 110-5. It is easily seen that the period of each waveform is 10 inverter delays.

Figure 2:
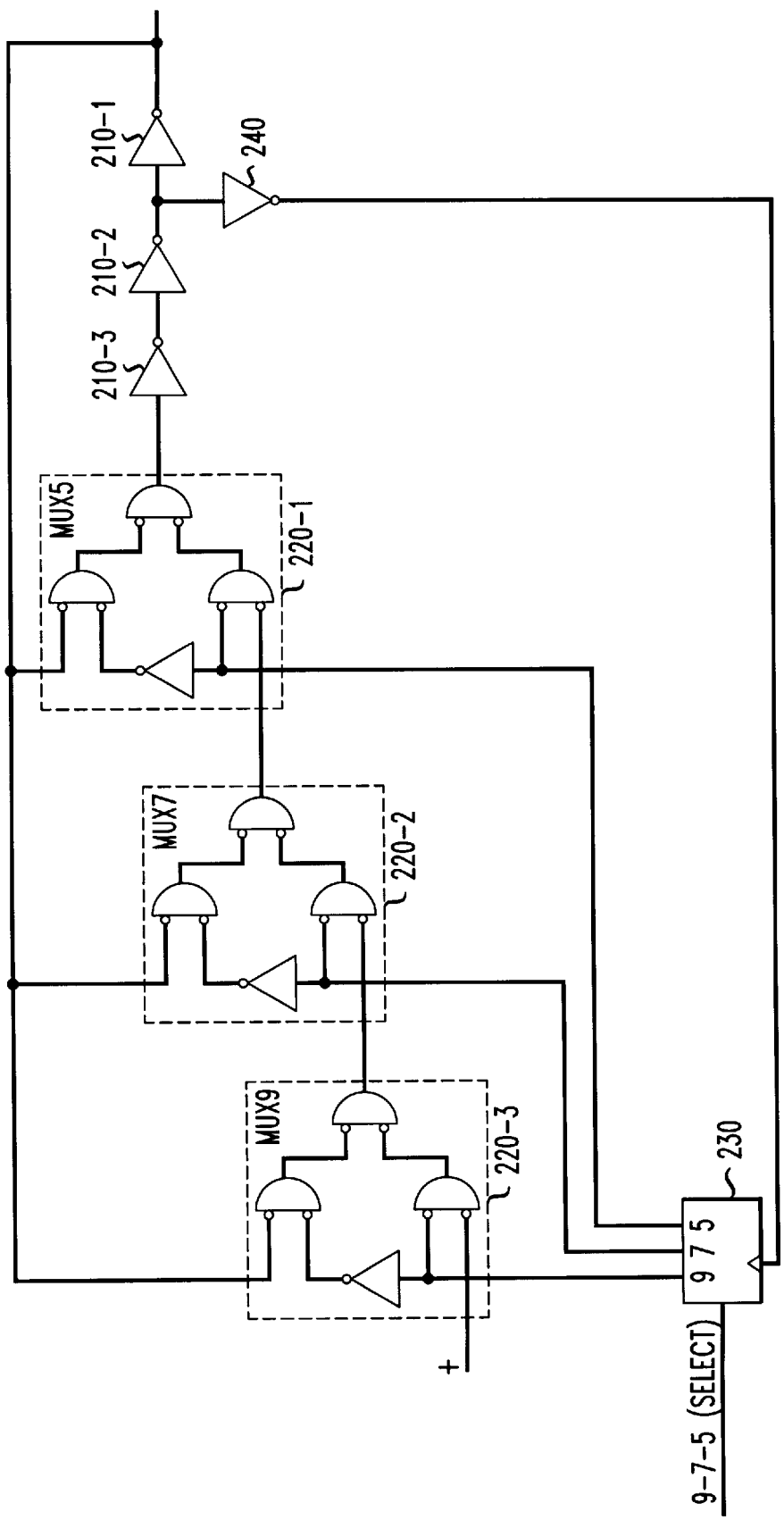
FIG. 2 illustrates a five-to-nine programmable period ring oscillator according to the present invention.

According to a feature of the present invention, shown in FIG. 2, a programmable period ring oscillator is obtained by selectively switching pairs of inverters into or out of such a ring oscillator. FIG. 2 illustrates a programmable period ring oscillator 200 that provides a range of five to nine inverters that may selectively be included in the ring oscillator in increments of two inverters. The programmable period ring oscillator 200 consists of three inverters 210-1 through 210-3 and three multiplexers 220-1 through 220-3 connected in a ring. Each multiplexer 220 includes two gate delays and has two inputs including a selection input. By selecting one of the three multiplexers 220 with a selection circuit 230, the selected multiplexer 220, and all lower order multiplexers are included in the ring. Thus, the number of inverter gate delays included in the ring may be selectively established.

If the "9" lead of the selection circuit 230 is high, the output of the ring oscillator (from inverter 210-1) is steered back through MUX9 220-3 (2 gate delays), plus the lower order MUX8 220-2 (2 gate delays) and MUX7 220-1 (2 gate delays). Thus, with the delay from the three inverters 210-1 through 210-3, the total delay through the ring oscillator with MUX9 selected is nine gate delays. Similarly, the total delay through the ring oscillator with MUX7 selected is seven gate delays and with MUX5 selected is five gate delays. Thus, the programmable period ring oscillator 200 permits the selection of an oscillator with a period of 5, 7, or 9 gate delays.

In this manner, the present invention provides a ring oscillator design with precise frequency control. A desired output frequency is obtained by merely entering the appropriate number into the selector 230 of FIG. 2.

Figure 3:
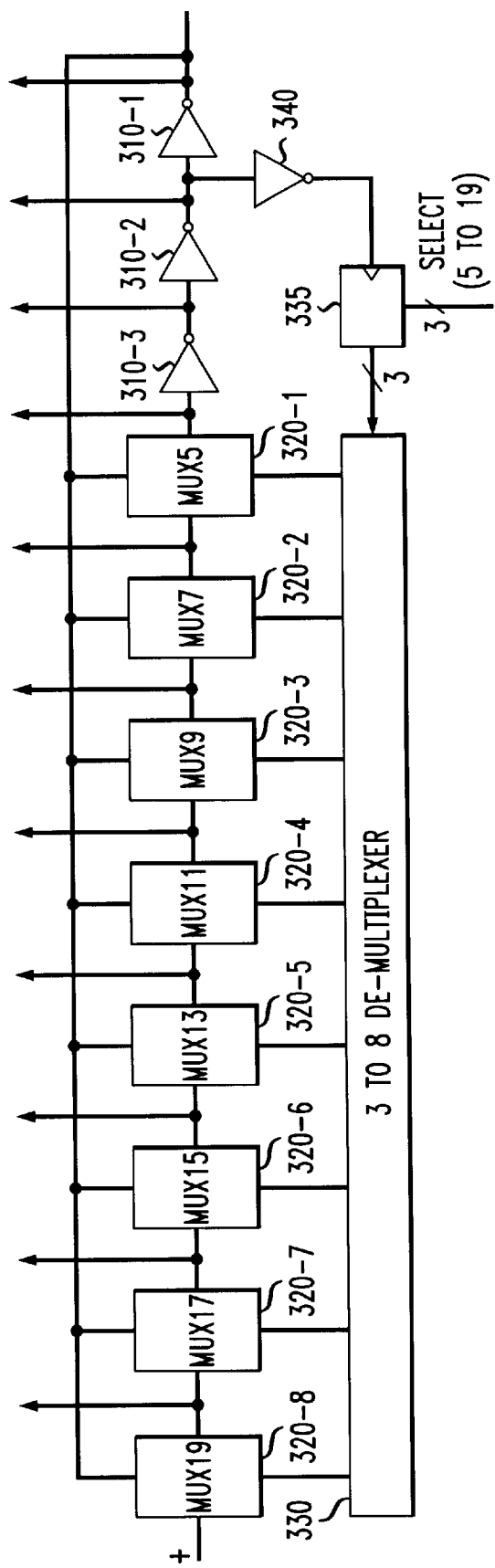
FIG. 3 illustrates a five-to-nineteen programmable period ring oscillator according to the present invention.

FIG. 3 illustrates a programmable period ring oscillator 300 that provides a range of five to nineteen inverters that may selectively be included in the ring oscillator in increments of two inverters. As discussed further below in conjunction with FIG. 5, the illustrative programmable period ring oscillator 300 has a frequency range of about 11.9 to 37.4 MHz, with a jitter of 5 nS. Of course, by using next generation CMOS technology the frequency could be increased and the jitter decreased by better than an order of magnitude.

In the programmable period ring oscillator 300 of FIG. 3, there are 8 multiplexers 320-1 through 320-8, one of which is selected from the output of a 3-to-8 demultiplexer 330. A three bit number is used as an input to the demultiplexer 330, which is used to enable one of the selection lines for a selected multiplexers 320-1 through 320-8. With the configuration of FIG. 3, both inputs of a given MUX 320 being selected or de-selected will be high, so there is no glitch generated due to the switching. As shown in FIG. 3, and discussed further below, the outputs of all of the MUXs 320 and the inverters 310 in the ring oscillator 300 are accessible, for the purpose of measuring the phase of the oscillator to a fraction of a cycle.

Figure 4:
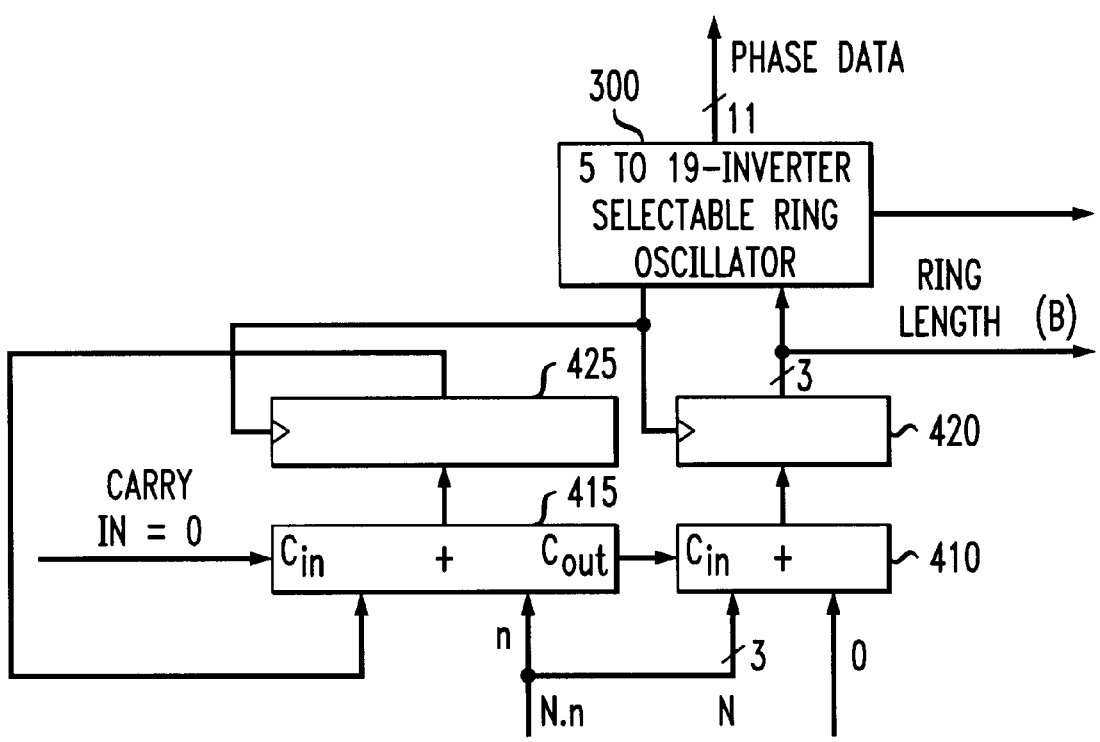
FIG. 4 illustrates a numerically controlled ring oscillator in accordance with the present invention.

FIG. 4 illustrates a numerically controlled ring oscillator 400 in accordance with the present invention. In particular, the circuitry of FIG. 4 provides a mechanism for precisely controlling the selection number that is the input to the ring oscillator 300 of FIG. 3. The circuitry of FIG. 4 utilizes a floating point binary representation for the input number, N·n, where the value n constitutes the least significant bits and the value N constitutes the most significant bits.

The circuitry of FIG. 4 includes an accumulator 415 that keeps adding the LSB bits, n, to itself, until there is an overflow, which is provided to the adder 410 on the carry out, $C_{out}$, line. Thus, the adder 410 adds the three MSB bits, N, to the carry out value, $C_{out}$, and the output of the adder 410 will be N whenever there is no overflow, and N+1 if there is an overflow. The carry value serves to average the numerical control value over time. The input value to the ring oscillator 300 of FIG. 3 will jitter back and forth, in order to get the desired frequency as an average over time. Latching devices 420 and 425 are provided and are respectively coupled to the outputs of adders 410 and 415. The latching devices 420 and 425 are operative to latch and stabilize the outputs of the adders. The latching device 420 produces a value, B, indicative of the RING LENGTH (the number of multiplexers 320 included in the ring).

Figure 5:
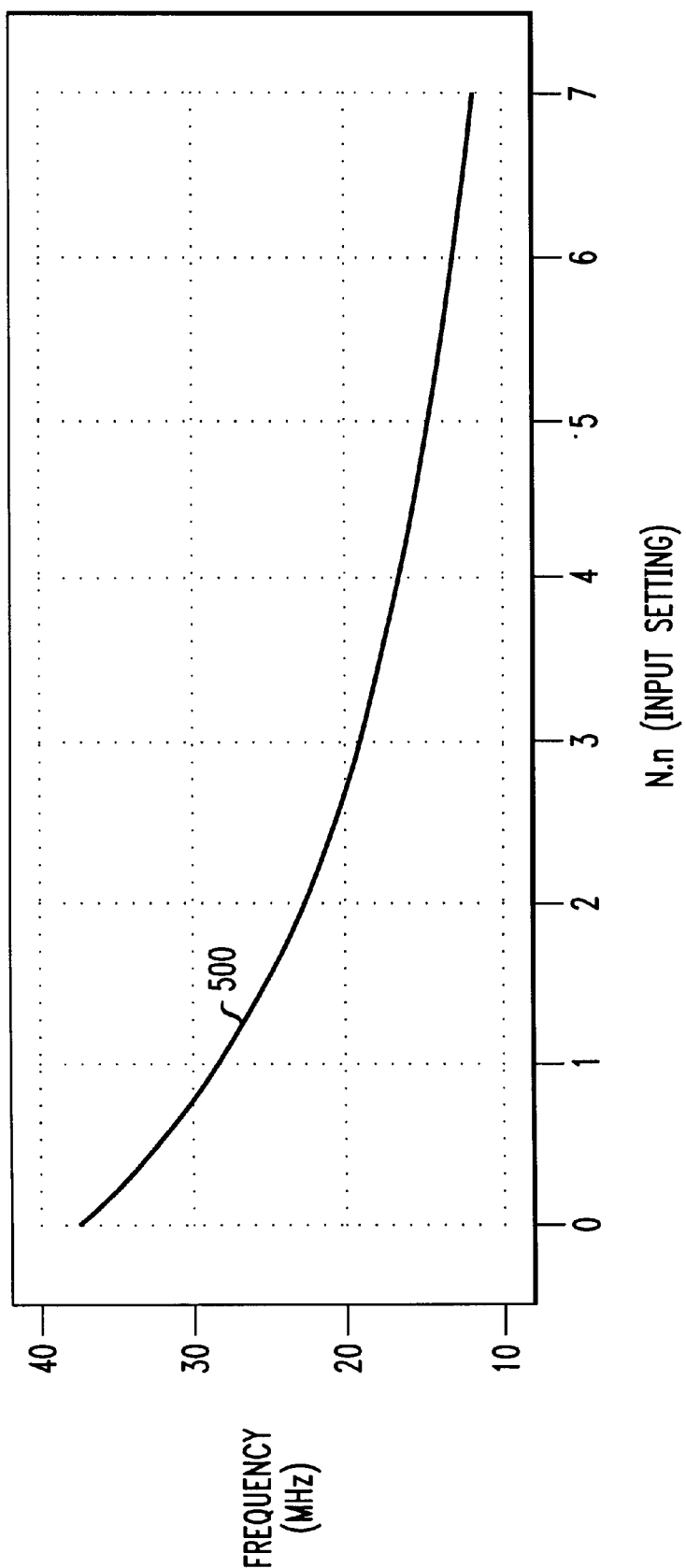
FIG. 5 illustrates the frequency range for the illustrative programmable period ring oscillator of FIG. 3.

FIG. 5 illustrates the frequency range for an illustrative programmable period ring oscillator 300 for an eight-bit input value that provides 256 frequency levels. As shown in FIG. 5, the frequency range of a ring oscillator 300 fabricated with 74AC CMOS logic is about 11.9 to 37.4 MHz, with a jitter of 5 nS.

Figure 6:
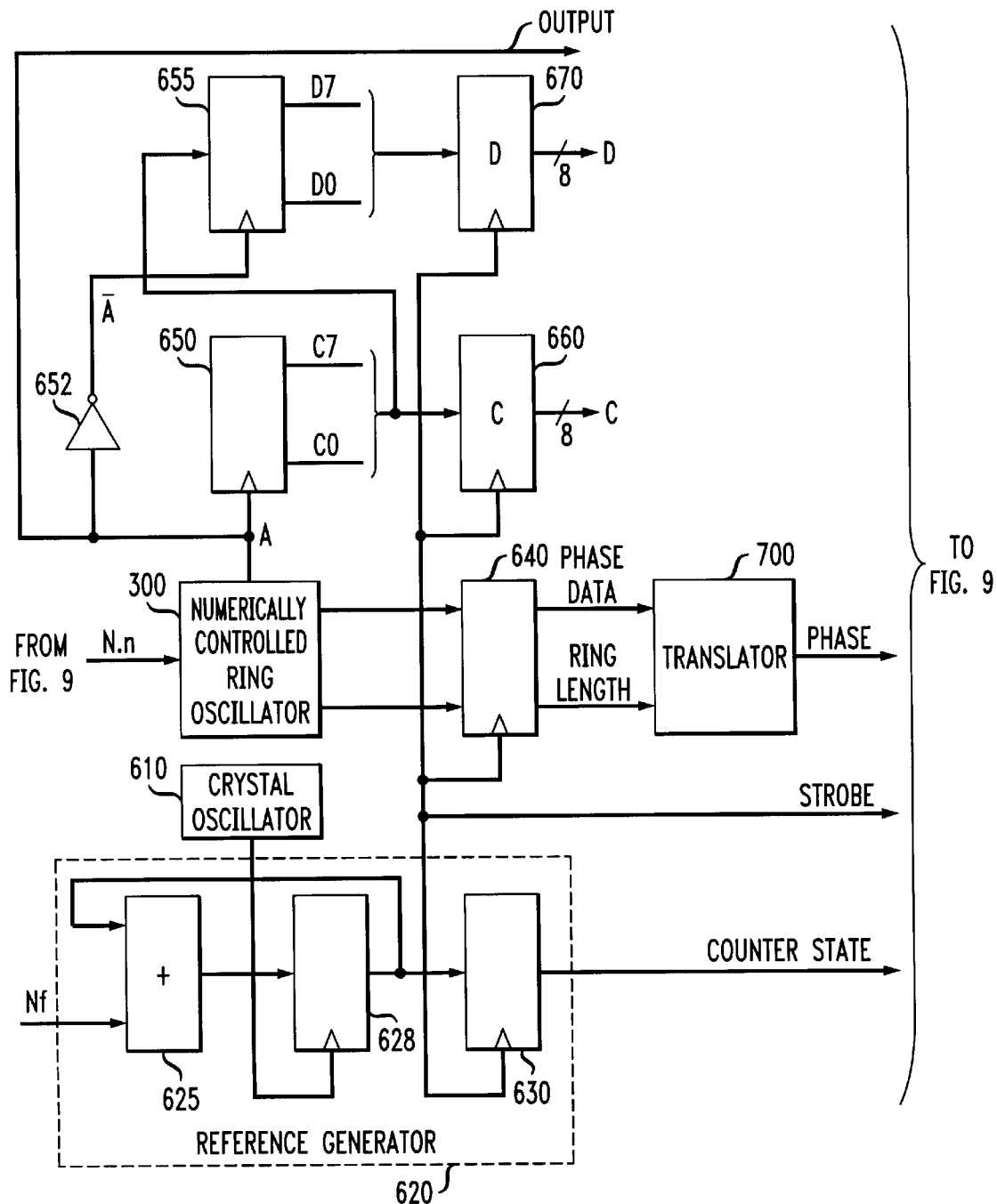
FIG. 6 illustrates a frequency synthesizer that compares the output of a ring oscillator in accordance with the present invention, with the output of a reference signal produced by a crystal controlled oscillator.

As previously indicated, it is often desirable for an oscillator output signal to be phase aligned with a reference signal. Thus, FIG. 6 illustrates a frequency synthesizer 600 that operates in conjunction with an N·n generator 1100, discussed below in conjunction with FIGS. 9 and 10, to compare the output of a ring oscillator 300 in accordance with the present invention, with the output of a reference signal produced by a crystal controlled oscillator 610. The frequency synthesizer 600 and N·n generator 1000 cooperate to generate a phase difference signal that is representative of the phase difference between the reference signal and the ring oscillator output. The phase difference signal is utilized to correct the frequency of the ring oscillator 300, so that the mean phase of the ring oscillator corresponds to the mean phase of the reference signal. The reference signal is used to simultaneously sample the state of the ring oscillator and to output its own state.

Generally, the resolution of the sampling can only be to within one cycle of the crystal oscillator. According to a feature of the present invention, however, the state of all of the stages in the ring oscillator are sampled, in a manner discussed below in conjunction with FIG. 7, to permit the phase of the ring oscillator to be measured to a small fraction of one cycle. Similarly, the LSBs of the reference signal contain the complete phase information of the reference signal. Thus, by taking the difference in the states of the ring oscillator 300 and the reference signal produced by the crystal controlled oscillator 610, an accurate error signal is obtained to adjust the output frequency of the ring oscillator.

As shown in FIG. 6, the translator 700, discussed below in conjunction with FIG. 7, generates an eight bit integer value representing the phase of the ring oscillator 300. As indicated above, the LSBs of the reference signal contain the complete phase information of the reference signal. The LSBs of the reference signal are obtained by adding the MSB bits, $N_f$, to itself, until there is an overflow in a reference generator 620. The reference generator 620 is comprised of an adder 625, and two registers 628, 630. The eight-bit COUNTER STATE value will thus contain an integer value corresponding to the phase of the reference signal. It is noted that the resolution of the present invention may be varied, as determined by the number of bits in the reference generator 620.

The adder 625 and the register 628 compose an N·n accumulator, such as a 4·8 accumulator, that accumulates $N_f$ modulo, such as 16 in the illustrative embodiment. Typically, the second most significant bit (count of 4) generates the STROBE signal. The whole number is then used to compare with the oscillator phase, in a manner described further below.

As shown in FIG. 6, a STROBE signal, generated by the register 628, is strobed into the registers 630, 640, 660 and 670. The STROBE signal thereby serves to align the outputs (C, D, COUNTER STATE, PHASE, STROBE, OUTPUT) of the circuitry 600 of FIG. 6, based on the timing of the reference generator.

The frequency synthesizer 600 includes a binary counter 650 that produces a signal, C, that is generated on a rising edge of its input signal, A. The input signal, A, is produced by the ring oscillator 300 and is defined in conjunction with FIG. 7. The C signals, C0 through C7, are clocked into the register 660 on the next rising edge of the STROBE signal. The C signal is also clocked into a register 655 on the opposite edge, using an inverted A signal produced by inverter 652. The D signals, D0 through D7, produced by the register 655 are clocked into the register 670 on the next rising edge of the STROBE signal. The C and D Gina signals, as well as all of the outputs of the frequency synthesizer 600 are applied to an N·n alignment circuit 900, discussed below in conjunction with FIG. 9.

Figure 7:
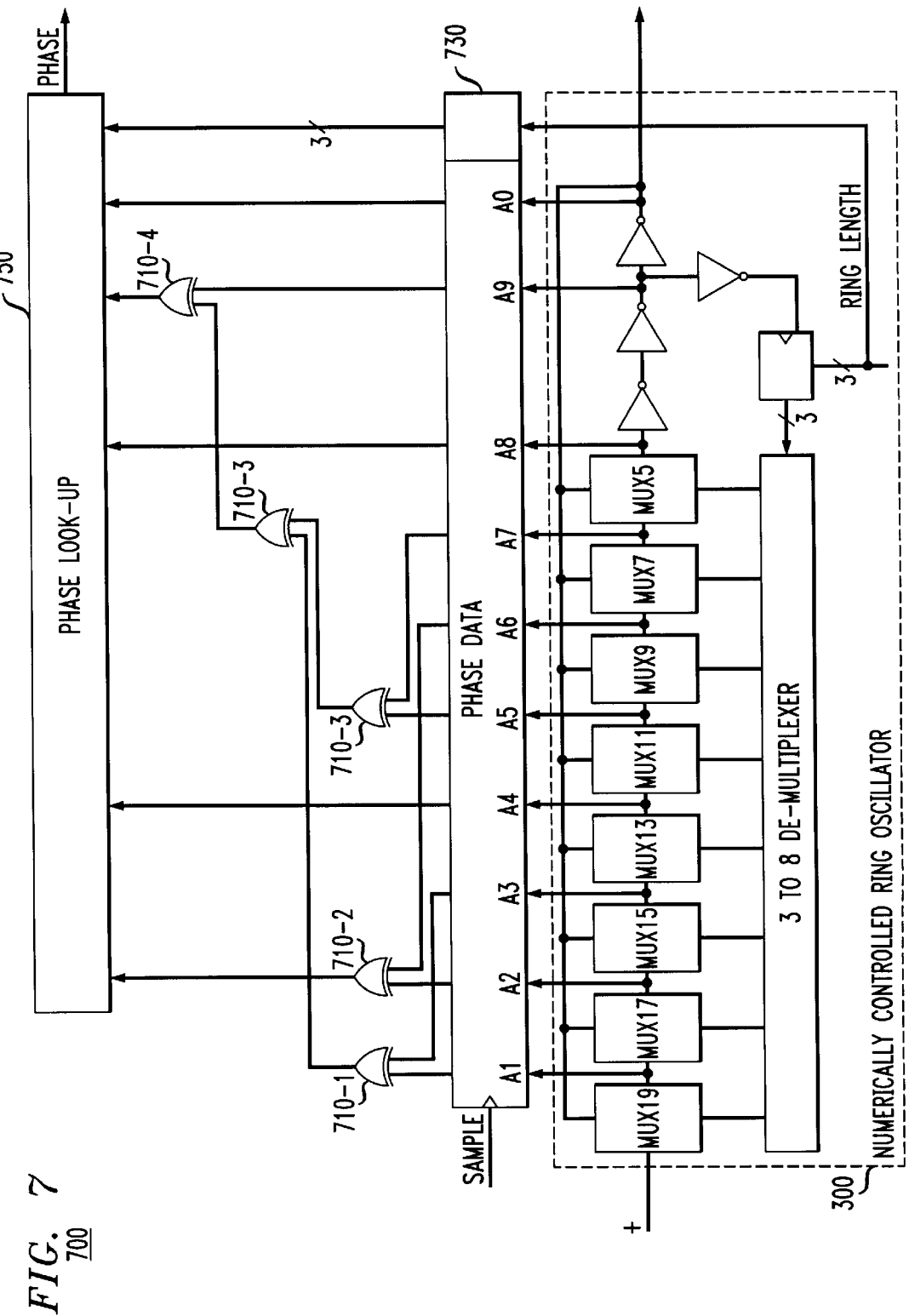
FIG. 7 is a schematic diagram of the translator of FIG. 6.

FIG. 7 illustrates the translator 700 of FIG. 6 in further detail. The translator 700 generates an integer value representing the phase of the ring oscillator 300. In order to measure the phase of the ring oscillator 300 to a fraction of a cycle, the outputs of all of the MUXs 320 and the inverters 310 are accessible. These ten outputs are applied to a phase data stage 730 that samples the phase of each output. The sampled outputs are then applied to a stage of exclusive OR gates 710-1 through 710-4 that collectively compensate for potential sampling delays.

The five bits produced by the stage of exclusive OR gates 710, as well as the three-bit gray coded ring length value are applied to a phase look-up state 750. The phase lookup state 750 utilizes a phase look-up table 800, shown in FIG. 8. In the illustrative eight-bit embodiment, the phase look-up table 800 provides 256 entries, each providing the corresponding phase value. It is noted that not all possible states are used. The states marked "16" in FIG. 8 will not normally be encountered. If the value "16" is retrieved from the table 800, due, for example, to a sampling error, no phase correction will be applied for the current sampling interval. Thus, the integer value representing the phase of the ring oscillator 300 is retrieved from the phase look-up table 800, based on the five bits based on the 10 outputs from the ring oscillator 300 and the three bits corresponding to the ring length (number of delay stages currently included in the ring oscillator 300).

The ring oscillator of the present invention provides a wide range, on the order of 3-to-1. Thus, in typical applications requiring a range of only 2-to-1, no trimming would be required. A broader range can be achieved by increasing the number of multiplexers in the ring oscillator 300.

Figure 9:
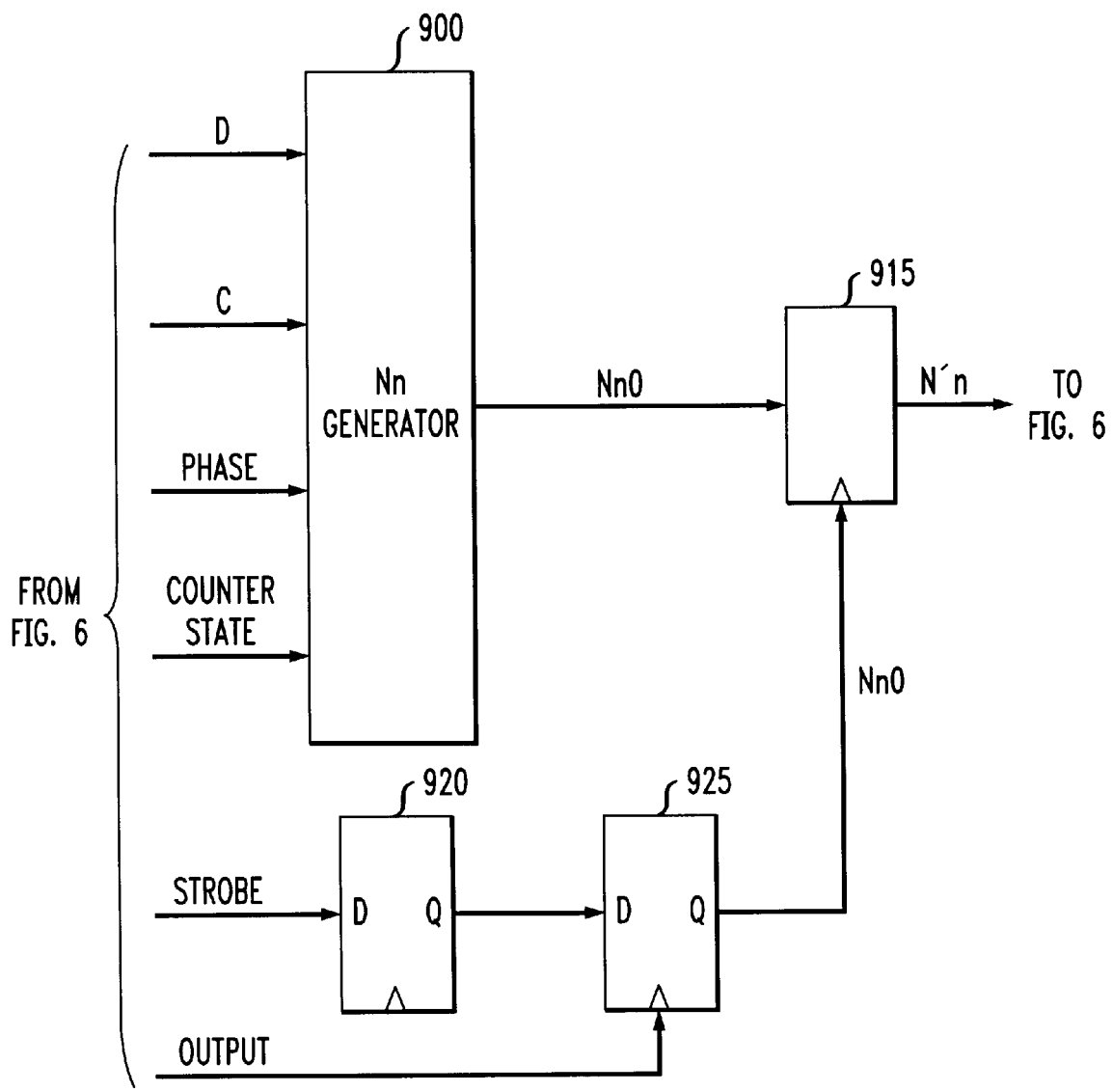
FIG. 9. illustrates an N·n alignment circuit that operates with the frequency synthesizer of FIG. 6 in accordance with the present invention.

As previously indicated, FIG. 9 illustrates an N·n alignment circuit 900 in accordance with the present invention. The N·n alignment circuit 900 receives the outputs, C, D, COUNTER STATE, PHASE, STROBE, OUTPUT, of the frequency synthesizer 600 of FIG. 6. As shown in FIG. 9, the N·n generator 1000 converts the signals D, C, PHASE and COUNTER STATE into a value N·n0, that is then resampled using a register 915 by the OUTPUT signal, to provide a signal of N·n. The signal N·n is thus aligned with the edge of the OUTPUT signal and thereby prevents glitches when the OUTPUT signal changes state. The N·n alignment circuit 900 also includes two D flip-flops 920, 925 that resample and delay the STROBE signal to X provide time for the N·n generator 1000 to settle. The STROBE signal occurs at nominally one-fourth of the output rate. In operation, the two D flip-flops 920, 925 resamples the edge of the STROBE signal to obtain a new edge that is aligned with the OUTPUT signal.

Figure 10:
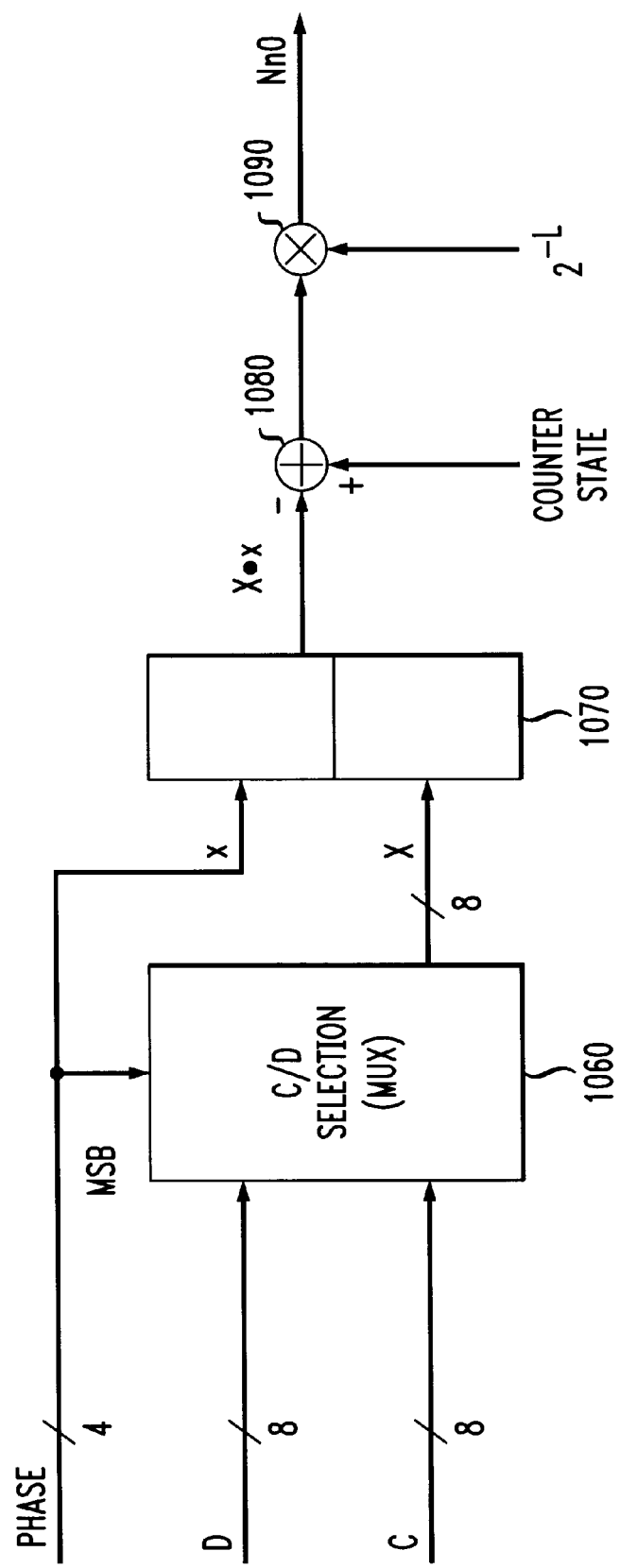
FIG. 10 illustrates the N·n generator of FIG. 9.
Figure 11A:
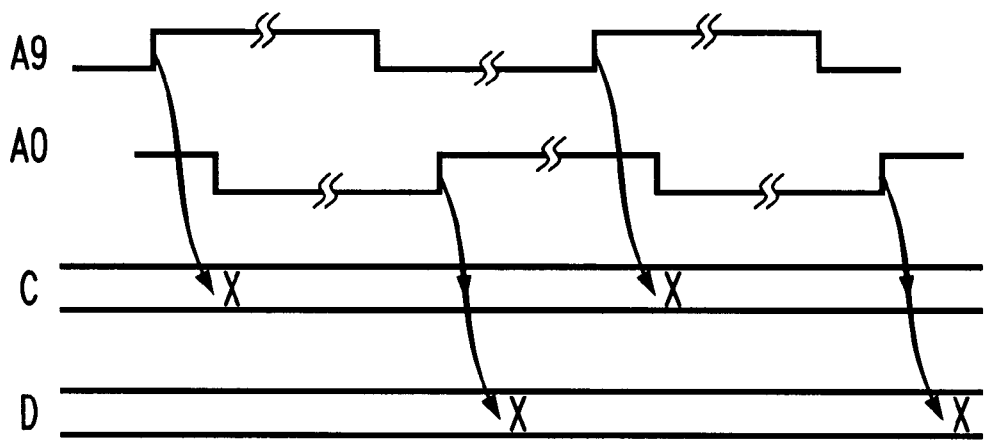
FIG. 11A illustrates the generation of the C and D signals, based on the A9 and A0 signals of FIG. 7.

FIG. 10 illustrates the N·n generator 1000. As shown in FIG. 10, the N·n generator 1000 receives the output of the translator 700, PHASE, and the C and D signals. As shown in FIG. 11A, the C counter is updated on a rising edge of the A9 signal (FIG. 7). In addition, C is clocked into D on the edge of inverter 652, which corresponds with A0 (FIG. 7).

The output of the phase look-up ROM 750 is adjusted so that it resets to a value of zero (0) between the rising edge of A9 and A0, and reaches the count of eight (8) between the rising edge of A0 and A9. Thus, when the MSB of the phase becomes zero (0) (and phase equals zero), the value of C has settled down (clocked in on A9) and so it is safe to select "C." Similarly, when the MSB of the phase becomes one (1) (phase equals nine), it is safe to select "D."

Figure 11B:
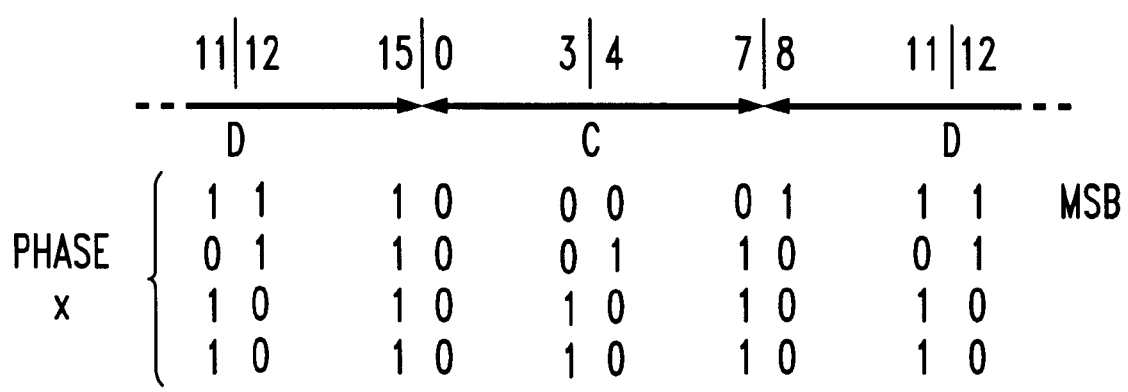
FIG. 11B illustrates the calculation used to support the logic used for the selection of the C or D signal in the multiplexer of FIG. 9.

As shown in FIG. 11B, if the MSB of the phase is zero (0) then C will be selected by the MUX 1060 and if the MSB of the phase is one (1) then D will be selected by the MUX 1060. The MUX 1060 produces an output, X, that is the eight MSBs of the phase of the ring oscillator 300, while the signal PHASE is the 4 MSBs of the phase of the ring oscillator 300. These 12 bits are combined at stage 1070 to produce the phase of the ring oscillator 300. This 12 bit phase value, X·x, is subtracted from the COUNTER STATE signal by an adder 1080 to provide the phase error of the ring oscillator 300. The phase error is then multiplied by $2^{-L}$ to set the correct loop gain.

It is to be understood that the embodiments and variations shown and described herein are merely illustrative of the principles of this invention and that various modifications may be implemented by those skilled in the art without departing from the scope and spirit of the invention.

I claim:

1. A ring oscillator, comprising:

at least one inverter and a plurality of multiplexers connected in a ring, each of said multiplexers including at least one gate delay;

selection circuitry for selectively including at least one of said multiplexers in said ring in accordance with a ring length value to provide a desired frequency, wherein said selection circuitry selects one of the plurality of multiplexers and whereby the selected multiplexer and all lower order multiplexers are included in said ring; and a dynamic binary control circuit for determining said ring length value, said dynamic binary control circuit averaging said ring length value over time to align a mean phase of said ring oscillator with a mean phase of a reference signal, said dynamic binary control circuit latching said ring length value using an output of said ring oscillator to ensure said ring length value does not change values when said output of said ring oscillator is changing states.

2. The ring oscillator of claim 1, wherein each of said multiplexers includes two gate delays and has a selection input.

3. The ring oscillator of claim 1, wherein each of said multiplexers includes at least one pair of inverters and said at least one pair of inverters is selectively switched into or out of said ring oscillator to provide a desired frequency.

4. The ring oscillator of claim 1, wherein said selection circuitry is controlled by a numerical input value.

5. A frequency synthesizer, comprising:

a programmable frequency ring oscillator having a plurality of inverters selectively connected in a ring, wherein a selected one of said plurality of inverters and all lower order inverters are included in said ring in accordance with a ring length value;

a reference signal source for producing a reference signal;

a comparison circuit for generating a phase difference signal corresponding to the difference in phase of an output of said programmable frequency ring oscillator and said reference signal, wherein said phase difference signal corrects the frequency of the output of said programmable frequency ring oscillator such that a mean phase of said ring oscillator corresponds to a mean phase of said reference signal; and a dynamic binary control circuit for determining said ring length value based on said phase difference signal, said dynamic binary control circuit latching said ring length value using an output of said ring oscillator to ensure said ring length value does not change values when said output of said ring oscillator is changing states.

6. The method of claim 5, wherein said reference signal source is includes a crystal oscillator.

7. The method of claim 5, wherein said phase difference signal selectively switches said inverters into or out of said programmable frequency ring oscillator to provide a desired frequency correction.

8. A frequency synthesizer, comprising:

a programmable frequency ring oscillator having a plurality of inverters selectively connected in a ring, wherein an output of each of said inverters is available for sampling, wherein a selected one of said plurality of inverters and all lower order inverters are included in said ring;

a reference signal source for producing a reference signal; and a comparison circuit for generating a phase difference signal corresponding to the difference in phase of an output of said programmable frequency ring oscillator and said reference signal, wherein said phase difference signal corrects the frequency of output of said programmable frequency ring oscillator such that a mean phase of said ring oscillator corresponds to a mean phase of said reference signal.

9. The method of claim 8, wherein said reference signal source is includes a crystal oscillator.

10. The method of claim 8, wherein said phase error selectively switches said inverters into or out of the programmable frequency ring oscillator to provide a desired frequency correction.

11. The method of claim 8, wherein said outputs of said inverters permits the phase of said programmable frequency ring oscillator to be measured to a fraction of one cycle.

12. The method of claim 8, wherein least significant bits of said reference signal contain complete phase information for said reference signal and wherein said phase difference provides an error signal to adjust the output frequency of the programmable frequency ring oscillator.

13. A method for generating an oscillator signal of a desired frequency, comprising the steps of:

connecting at least one inverter and a plurality of multiplexers in a ring, wherein each of said multiplexers include at least one gate delay;

selectively including at least one of said multiplexers and all lower order multiplexers in said ring in accordance with a ring length value to provide a desired frequency;

determining said ring length value, said dynamic binary control circuit averaging said ring length value over time to align a mean phase of said ring oscillator with a mean phase of a reference signal; and latching said ring length value using an output of said ring oscillator to ensure said ring length value does not change values when said output of said ring oscillator is changing states.

14. The method of claim 13, wherein each of said multiplexers includes two gate delays and has a selection input.

15. The method of claim 13, wherein each of said multiplexers includes at least one inverter.

16. The method of claim 13, further comprising the step of selectively switching pairs of inverters into or out of said ring oscillator to provide a desired frequency.

17. The method of claim 13, further comprising the step of controlling said selection circuitry by a numerical input value.

18. A method for generating an oscillator signal of a desired frequency, comprising the steps of:

generating an oscillator signal using a programmable frequency ring oscillator having a plurality of inverters selectively connected in a ring, wherein a selected one of said plurality of inverters and all lower order inverters are included in said ring in accordance with a ring length value;

generating a reference signal source;

generating a phase difference signal corresponding to the difference in phase of said oscillator signal and said reference signal, wherein said phase difference signal corrects the frequency of the oscillator signal such that a mean phase of said oscillator signal corresponds to a mean phase of said reference signal;

determining said ring length value based on said phase difference signal; and latching said ring length value using an output of said ring oscillator to ensure said ring length value does not change values when said output of said ring oscillator is changing states.

19. A method for generating an oscillator signal of a desired frequency, comprising the steps of:

generating an oscillator signal using a programmable frequency ring oscillator having a plurality of inverters selectively connected in a ring, wherein a selected one of said plurality of inverters and all lower order inverters are included in said ring;

providing an output of each of said inverters for sampling, wherein said outputs of said inverters permits the phase of said programmable frequency ring oscillator to be measured to a fraction of one cycle;

generating a reference signal source; and generating a phase difference signal corresponding to the difference in phase of said oscillator signal and said reference signal, wherein said phase difference signal corrects the frequency of the oscillator signal such that a mean phase of said oscillator signal corresponds to a mean phase of said reference signal.

* * * * *